(12) United States Patent
Sun

(10) Patent No.: US 8,855,336 B2
(45) Date of Patent: Oct. 7, 2014

(54) SYSTEM AND METHOD FOR BIASING ACTIVE DEVICES

(75) Inventor: Bo Sun, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1094 days.

(21) Appl. No.: 12/636,542

(22) Filed: Dec. 11, 2009

(65) Prior Publication Data

US 2011/0142263 A1 Jun. 16, 2011

(51) Int. Cl.
*H04R 3/00* (2006.01)
*G05F 1/46* (2006.01)
*H03F 1/02* (2006.01)
*H03F 3/195* (2006.01)
*H03F 1/22* (2006.01)
*H04B 1/69* (2011.01)

(52) U.S. Cl.
CPC .......... *G05F 1/46* (2013.01); *H03F 2200/321* (2013.01); *H03F 2200/294* (2013.01); *H04B 2001/6908* (2013.01); *H03F 1/0261* (2013.01); *H03F 2200/108* (2013.01); *H03F 3/195* (2013.01); *H03F 2200/27* (2013.01); *H03F 1/223* (2013.01)
USPC ............................ 381/122; 330/296; 330/285

(58) Field of Classification Search
USPC ........................... 330/285, 296, 311, 277, 273
See application file for complete search history.

(56) References Cited

U.S. PATENT DOCUMENTS

| 6,563,385 | B2 | 5/2003 | Wojslaw | |
|---|---|---|---|---|
| 7,307,478 | B2 * | 12/2007 | Anand | 330/285 |
| 7,812,667 | B2 | 10/2010 | Fagg | |
| 8,068,622 | B2 * | 11/2011 | Melanson et al. | 381/120 |
| 2002/0186157 | A1 | 12/2002 | Tanaka | |
| 2009/0086511 | A1 | 4/2009 | Lin | |

FOREIGN PATENT DOCUMENTS

| CN | 101507105 A | 8/2009 |
|---|---|---|
| CN | 101589450 A | 11/2009 |
| CN | 101589451 A | 11/2009 |
| CN | 101589451 A | 11/2009 |
| JP | H06216727 A | 8/1994 |

(Continued)

OTHER PUBLICATIONS

Bishop O, "The Digital Solution OPART 10 (Final)—Back to the Real World", Elekto, Canterbury, GB, vol. 21, No. 237, Oct. 1, 1995, pp. 50-53, XP000534098, ISSN: 0268-4519.

(Continued)

*Primary Examiner* — Hieu Nguyen
(74) *Attorney, Agent, or Firm* — Paul S. Holdaway

(57) ABSTRACT

An apparatus for generating a bias voltage for an active device is disclosed, comprising a first voltage source, a capacitive element adapted to generate a charge in response to the first voltage source, and a first switching element adapted to deliver the charge to generate the bias voltage for the active device. The apparatus may comprise a controller adapted to control a capacitive element based on one or more characteristics of the active device. Alternatively, the controller may also control the capacitance of the capacitive element based on a reference voltage that is, in turn, based on one or more characteristics of the active device. The apparatus may also comprise a second voltage source adapted to generate a second voltage from which the bias voltage may be generated. The second voltage may be based on one or more characteristics of the active device. The apparatus may comprise a second switching element adapted to selectively enable and disable the active device.

37 Claims, 8 Drawing Sheets

(56) References Cited

FOREIGN PATENT DOCUMENTS

| | | |
|---|---|---|
| JP | H09246872 A | 9/1997 |
| JP | 2002359559 A | 12/2002 |
| JP | 2004336191 A | 11/2004 |
| JP | 2009089578 A | 4/2009 |
| WO | WO-2009114021 A1 | 9/2009 |

OTHER PUBLICATIONS

Bishop O, "The Digital Solution OPART 10 (Final)—Back to the Real World", Elektor, Canterbury, GB, vol. 21, No. 237, Oct. 1, 1995, pp. 50-53, XP000534098, ISSN: 0268-4519.

International Search Report and Written Opinion—PCT/US2010/059936, ISA/EPO—May 4, 2011.

* cited by examiner

SYSTEM AND METHOD FOR BIASING ACTIVE DEVICES

FIELD

The present disclosure relates generally to power supplying systems, and more specifically, to a system and method for generating a bias voltage for an active device.

BACKGROUND

The bursty nature of highly dynamic loads causes current demands on a power regulator to go, for example, from a few micro Amps (μA) to tens of milli Amps (mA) within a short period of time (e.g., in the order of 3 nanoseconds (ns) for the case of an ultra wideband (UWB) application). Moreover, the power regulator has to recover from the initial burst and be ready for the next burst within a very short period (e.g., 10-20 ns for a pulse position UWB system). Along with this rapidly changing load requirement, there are load regulation specifications that typically restrict the maximum voltage ripple across the load to values below a few tens of milli Volts (mV).

The dynamic requirements typically associated with bursty load operations generally preclude the use of conventional voltage regulation schemes, such as Low Drop Out (LDO) regulators or Switch-Mode Power Supplies (SMPS) which, due to their inherent feedback regulation schemes and relatively low bandwidth, typically cannot react fast enough to the rapid changes of the load profile. As a consequence, one of the regulation aspects is invariably compromised: the ripple voltage, the regulation capabilities, or the regulation capacitance size which may become undesirably large.

The current solutions to tackle this type of requirements are generally ineffective in solving the problem. For example, the use of an LDO regulator for regulation of such a bursty supply would be difficult for the reason that the loop is not fast enough to regulate the supply within a very short time period (e.g., 12.5 ns). Moreover, the stringent requirements on the maximum droop tolerated generally require a very large bypass capacitor. Furthermore, the loop bandwidth of the LDO is limited by the stability requirement and an LDO with a few ns response is difficult to realize.

SUMMARY

An aspect of the disclosure relates to an apparatus for generating a bias voltage for an active circuit. The apparatus comprises a first voltage source, a capacitive element adapted to generate a charge in response to the first voltage source, and a first switching element adapted to deliver the charge to be used to generate the bias voltage for the active device. In another aspect, the apparatus comprises a controller adapted to control a capacitance of the capacitive element. In yet another aspect, the controller is adapted to control the capacitance of the capacitive element based on one or more characteristics of the active device. In still another aspect, the one or more characteristic of the active device comprise a gain of the active device.

In another aspect of the disclosure, the controller is adapted to control the capacitance of the capacitive element based on a reference voltage. In another aspect, the reference voltage is based on one or more characteristics of the active device. In yet another aspect, the apparatus comprises a second voltage source adapted to generate the reference voltage.

In another aspect of the disclosure, the apparatus further comprises a second voltage source adapted to generate a second voltage that is also used to form the bias voltage. In another aspect, the second voltage source is adapted to produce a second voltage based on one or more characteristics of the active device. In still another aspect, the apparatus comprises a second switching element adapted to selectively couple the first voltage source to the active device to enable the active device. In yet another aspect, the apparatus comprises a second switching element adapted to selectively couple the active device to ground or other potential to disable the active device.

Other aspects, advantages and novel features of the present disclosure will become apparent from the following detailed description of the disclosure when considered in conjunction with the accompanying drawings.

DETAILED DESCRIPTION

Various aspects of the disclosure are described below. It should be apparent that the teachings herein may be embodied in a wide variety of forms and that any specific structure, function, or both being disclosed herein are merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Figure 1:
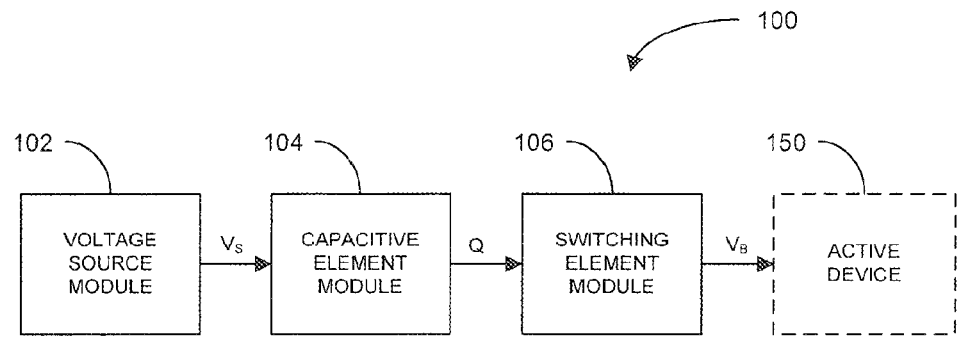
FIG. 1 illustrates a block diagram of an exemplary apparatus for generating a bias voltage for an active device in accordance with an aspect of the disclosure.

FIG. 1 illustrates a block diagram of an exemplary apparatus 100 for generating a bias voltage $V_B$ for an active device 150 in accordance with an aspect of the disclosure. The apparatus 100 comprises a voltage source module 102 as a means for generating a voltage $V_S$, a capacitive element module 104 as a means for generating a charge in response to the voltage $V_S$, and a switching element module 106 as a means for delivering the charge to be used to generate the bias voltage $V_B$ for the active device 150.

In one aspect, the process of generating the bias voltage $V_B$ may involve the following operations: (1) coupling the voltage source module 102 to the capacitive element module 104 for a defined time interval to generate a defined amount of charge Q; (2) once the defined amount of charge Q is generated, decoupling the voltage source module 102 from the capacitive element module 104; and (3) then activating the switching element module 106 in order to couple the capacitive element module 104 to the active device 150, so that the charge Q is delivered to generate the bias voltage $V_B$ for the active device. This process may be more suitable for the case where leakage current associated with the biasing of the active device 150 is relatively small or negligible, so that the bias voltage $V_B$ remains substantially constant (e.g., a defined constant level) during the operation of the active device.

In another aspect, the process of forming the bias voltage $V_B$ may involve the following operations: (1) coupling the voltage source module 102 to the capacitive element module 104 for a defined time interval to generate a defined amount of charge Q; and (2) then activating the switching element module 106 in order to couple both the voltage source module 102 and the capacitive element module 104 to the active device 150, so that the charge Q and source voltage $V_S$ both contribute to generating the bias voltage $V_B$ for the active device. This process may be more suitable for the case where leakage current associated with biasing the active device 150 is significant, which may result in a significant drop in the bias voltage $V_B$. Thus, in order to maintain the bias voltage $V_B$ substantially constant (e.g., a defined constant level) during the operation of the active device 150, the voltage source module 102 is maintained coupled to the active device.

Figure 2:
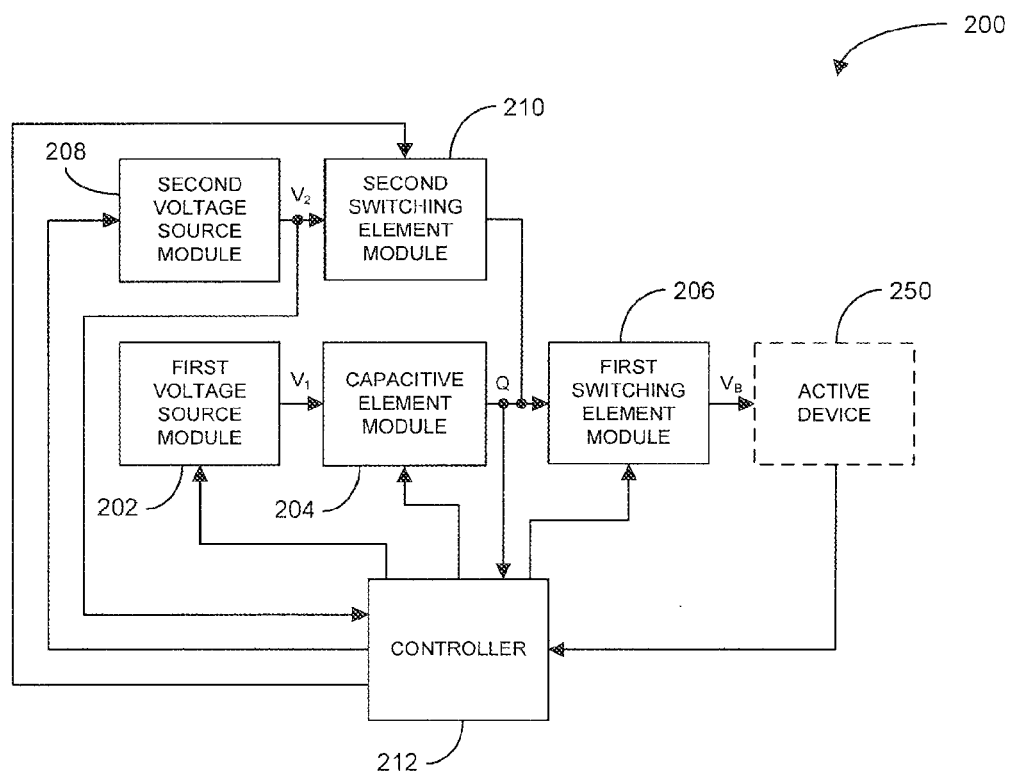
FIG. 2 illustrates a block diagram of another exemplary apparatus for generating a bias voltage for an active device in accordance with another aspect of the disclosure.

FIG. 2 illustrates a block diagram of another exemplary apparatus 200 for generating a bias voltage $V_B$ for an active device 250 in accordance with another aspect of the disclosure. In summary, the apparatus 200 includes a source of charge Q used for generating the bias voltage $V_B$ for the active device 250. Additionally, the apparatus 200 includes a voltage source adapted to generate a reference voltage for calibrating a capacitive element module. Such voltage may also be used as a supplemental voltage to compensate for leakage current associated with the biasing of the active device 250. In addition, the apparatus 200 includes a switching element for delivering the charge Q and/or supplemental voltage in order to generate the bias voltage $V_B$ for the active device 250. Further, the apparatus 200 includes a controller for detecting one or more characteristics (e.g., signal gain, bias voltage $V_B$, etc.) of the active device 250, and adjusting the reference voltage in accordance with the detected one or more characteristics.

In particular, the apparatus 200 comprises a first voltage source module 202, a capacitive element module 204, a first switching element module 206, a second voltage source module 208, a second switching element module 210, and a controller 212. Both the first voltage source 202 and the capacitive element module 204 are configured to generate a defined amount of charge Q under the control of the controller 212. More specifically, the first voltage source module 202 is adapted to generate a first voltage $V_1$. The capacitive element module 204 is adapted to generate a charge Q based on and/or in response to the first voltage $V_1$. The controller 212 may detect one or more characteristics of the active device 250, and may control the charge Q based on the detected one or more characteristics.

The second voltage source module 208 and the second switching element module 210 are adapted to generate a reference voltage $V_2$ used for calibrating the capacitive element module 204. Additionally, the voltage $V_2$ may be used as a supplemental voltage which, in conjunction with the charge Q generated by the capacitive element module 204, generates the bias voltage $V_B$ for the active device 250. For example, the supplemental voltage $V_2$ may be used when there is significant leakage current associated with the biasing of the active device 250. In such a case, without the use of the supplemental voltage $V_2$, the bias voltage $V_B$ may drop significantly during the operation of the active device 250. On the other hand, with the supplemental voltage $V_2$, the bias voltage $V_B$ may be maintained within a defined voltage range. More specifically, the second voltage source 208 is adapted to generate the voltage $V_2$ under the control of the controller 212. The controller 212 may detect one or more characteristics of the active device 250, and may control the supplemental voltage $V_2$ based on the detected one or more characteristics.

Additionally, the controller 212 may configure the second voltage source module 208 to generate a reference voltage used for calibrating the capacitance of the capacitive element module 204. For example, the controller 212 may adjust the reference voltage $V_2$ based one or more characteristics of the active device 250. Once the reference voltage is set, the controller 212 may activate the first voltage source module 202 and capacitive element module 204 to form charge Q, and develop a voltage at the output of the capacitive element module 204. Then, the controller 212 may adjust the capacitance of the capacitive element module 204 to adjust the voltage at its output based on the reference voltage $V_2$. Finally, the controller 212 may selectively activate the first and/or second switching element modules 206 and 210 for delivering the charge Q and/or supplemental voltage $V_2$ in order to generate the bias voltage $V_B$ for the active device 250.

Figure 3:
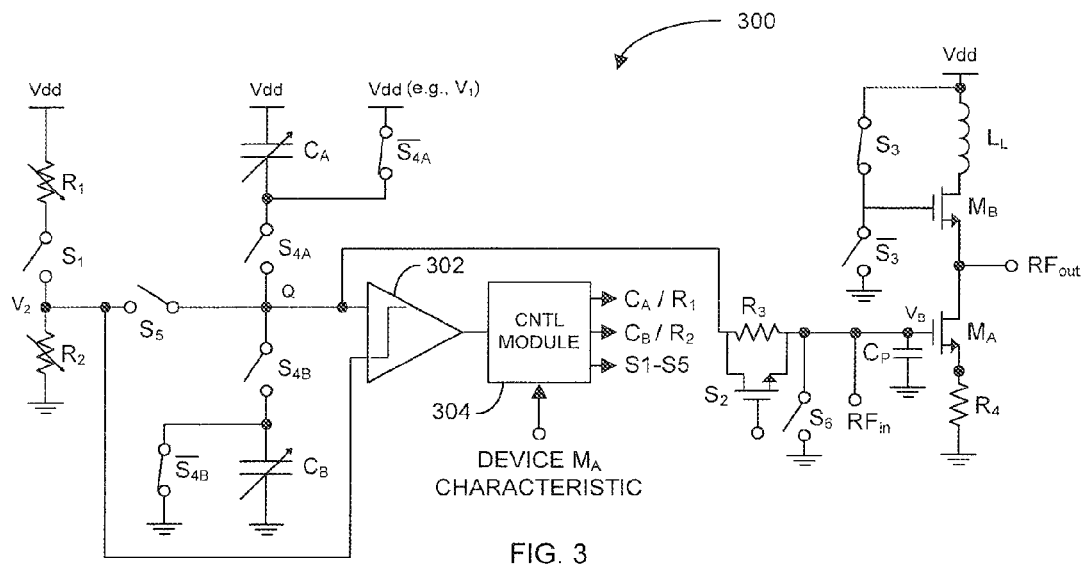
FIG. 3 illustrates a block diagram of another exemplary apparatus for generating a bias voltage for an active device in accordance with another aspect of the disclosure.

FIG. 3 illustrates a block diagram of another exemplary apparatus 300 for generating a bias voltage $V_B$ for an active device $M_A$ in accordance with another aspect of the disclosure. The apparatus 300 may be a more detailed implementation of the apparatuses 100 and 200, previously discussed. In summary, the apparatus 300 includes a source of charge Q used for generating the bias voltage $V_B$ for the active device $M_A$. Additionally, the apparatus 300 includes a voltage source adapted to generate a reference voltage $V_2$ used to calibrate the charge forming element. Additionally, the voltage $V_2$ may also be used as a supplemental voltage to compensate for leakage current associated with biasing the active device $M_A$. In addition, the apparatus 300 includes a switching element for delivering the charge Q and/or voltage $V_2$ in order to form the bias voltage $V_B$ for the active device $M_A$. Further, the apparatus 300 includes a controller for detecting one or more characteristics (e.g., signal gain, bias voltage $V_B$, etc.) of the active device $M_A$, and adjusting the reference voltage $V_2$ in accordance with the detected one or more characteristics.

In particular, the apparatus 300 comprises resistors $R_1$, $R_2$, and $R_3$, capacitors $C_A$ and $C_B$, switches $S_1$-$S_6$, comparator 302, and calibration controller 304. The power supply voltage Vdd, resistors $R_1$ and $R_2$, and switch $S_1$ may be configured as the second voltage source module, as discussed above, to generate a reference or supplemental voltage $V_2$. The power supply voltage Vdd, capacitors $C_A$ and $C_B$, and switches $S_{4A}$, $\overline{S_{4B}}$, $S_{4A}$ and $\overline{S_{4B}}$ may be configured as the capacitive element module, as discussed above, to generate a charge Q based on or in response to the power supply voltage Vdd (e.g., such as $V_1$ discussed above). The resistor $R_3$ and switch $S_2$ may be configured as a first switching element module, as discussed above, to selectively deliver the charge Q and/or the supplemental voltage $V_2$ to generate the bias voltage $V_B$ for the active device $M_A$. During the presence of the input RF signal, the switch $S_2$ may be turned off, and the resistor $R_3$ substantially prevents the input RF signal from leaking towards the direction of the capacitors $C_A$ and $C_B$.

The switch $S_5$ may be configured as the second switching element module, as discussed above, for selectively applying the supplemental voltage $V_2$ to the input of the first switching element module (e.g., $S_2$ and $R_3$). As a reference, the voltage $V_2$ is applied to an input of the comparator 302 for the purpose of calibrating the capacitive element module (e.g., $C_A$ and $C_B$). The comparator 302 generates an output that is a function of the difference between the reference voltage $V_2$ and the voltage associated with the charge Q. The control module 304 is adapted to adjust the capacitance of capacitors $C_A$ and $C_B$ and/or resistors $R_1$ and $R_2$ based on one or more characteristics (e.g., signal gain, bias voltage $V_B$, etc.) of the active device $M_A$. The processes related to the calibration of these parameters and the forming of the bias voltage $V_B$ are discussed further below with reference to flow and timing diagrams.

In this example, the active device $M_A$ may be configured as a metal oxide semiconductor field effect transistor (MOSFET). The active device $M_A$ may have an effective input capacitance of $C_P$, which may include the gate-source capacitance of device $M_A$, capacitance associated with bias resistor $R_4$, and other parasitic capacitance. The switch $S_6$ may be configured to selectively discharge the capacitor $C_P$. The active device $M_A$ may be associated with other devices for, e.g., biasing, fast enabling/disabling, and frequency tuning of the device. For example, as discussed above, the resistor $R_4$ may be configured to generate a defined source voltage or gate-source voltage for the device $M_A$. The switches $S_3$ and $\overline{S_3}$ and MOSFET $M_B$ may be configured to fast enable and disable the active device $M_A$. For instance, when $S_3$ is ON (opened) and $\overline{S_3}$ is OFF (closed), the MOSFET $M_B$ is turned ON, allowing the power supply voltage Vdd to be applied to the device $M_A$ via an inductance $L_L$ associated with a load. When $S_3$ is OFF and $\overline{S_3}$ is ON, the MOSFET $M_B$ is turned OFF to block the power supply voltage Vdd from being applied to the device $M_A$.

Further, in this example, the active device $M_A$ may be configured as a radio frequency (RF) amplifier (e.g., such as a low noise amplifier (LNA)), whereupon the gate of device $M_A$ is adapted to receive the input RF signal, and the drain of the device $M_A$ is adapted to produce the output RF signal. The load inductance $L_L$ may be configured to set a defined center frequency and bandwidth for the amplifier $M_A$. It shall be understood that such amplifier is merely one example, and other variations and/or types may utilize the biasing technique described herein. For example, the amplifier could be a common source amplifier without degeneration resistor $R_4$. Other types of amplifiers or devices that may need a bias voltage to settle in a relatively short period may utilize the techniques described herein.

Figure 4:
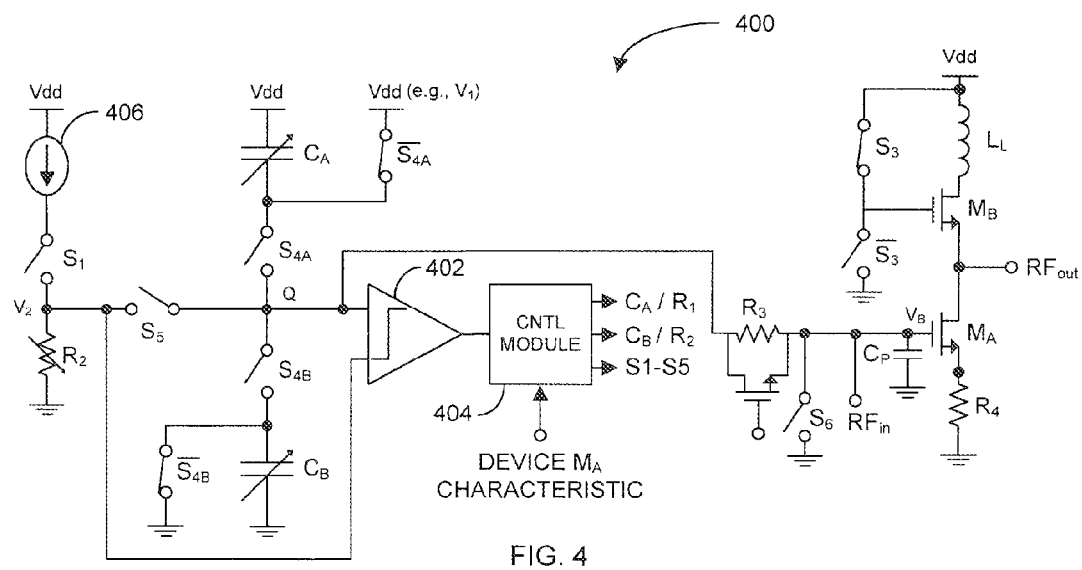
FIG. 4 illustrates a block diagram of another exemplary apparatus for generating a bias voltage for an active device in accordance with another aspect of the disclosure.

FIG. 4 illustrates a block diagram of another exemplary apparatus 400 for generating a bias voltage $V_B$ for an active device $M_A$ in accordance with another aspect of the disclosure. The apparatus 400 is similar to the apparatus 300 previously discussed, and includes the same elements which are designated with the same reference symbols, and the same reference numbers except the most significant digit is a "4" instead of a "3". The difference in the apparatuses 300 and 400 is that the resistor $R_1$ in apparatus 300 is replaced with a current source 406, which could be made to generate a substantially fixed or variable current. Other configurations for the second voltage source module and other modules of apparatuses 300 and 400 may be implemented.

Figure 5:
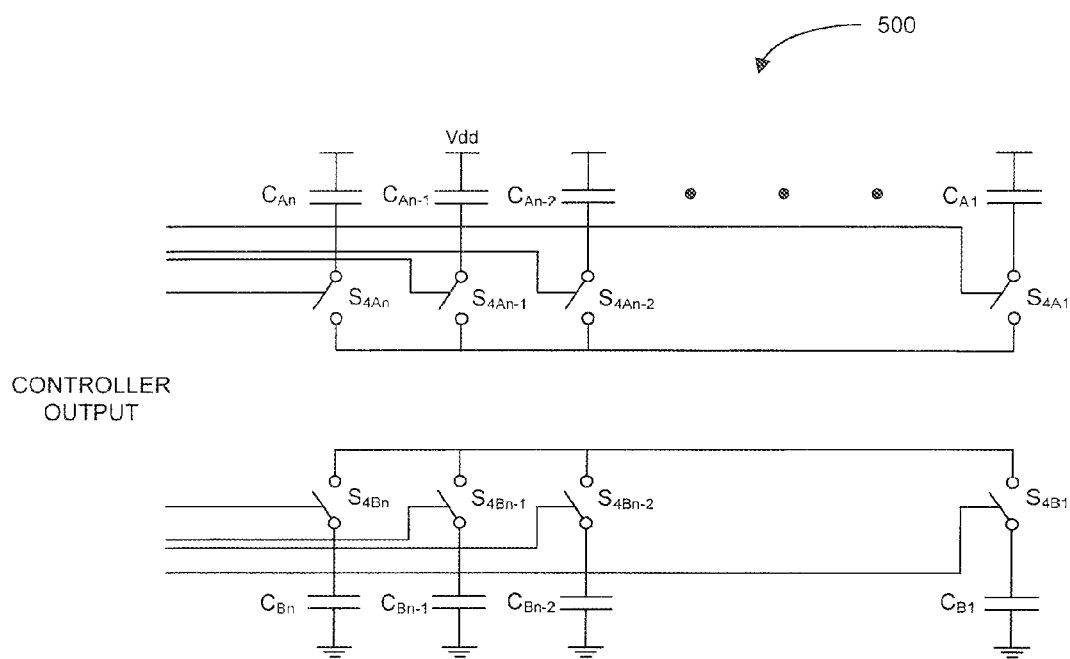
FIG. 5 illustrates a block diagram of an exemplary capacitive element module in accordance with another aspect of the disclosure.

FIG. 5 illustrates a block diagram of an exemplary capacitive element module 500 in accordance with another aspect of the disclosure. The capacitive element module 500 may be a detailed implementation of the capacitive element modules previously discussed. In this example, the capacitive element module 500 comprises a first binary-weighted capacitor bank including capacitors $C_{A1}$ to $C_{An}$ coupled in series with corresponding switches $S_{4A1}$ to $S_{4An}$, respectively. The capacitive element module 500 comprises a second binary-weighted capacitor bank including capacitors $C_{B1}$ to $C_{Bn}$ coupled in series with corresponding switches $S_{4B1}$ to $S_{4Bn}$, respectively. With reference to apparatuses 300 and 400, the first binary-weighted capacitor bank $C_{A1}$ to $C_{An}$ may be a more detailed implementation of variable capacitor $C_A$. The corresponding switches $S_{4A1}$ to $S_{4An}$ may be a more detailed implementation of switch $S_{4A}$. The second binary-weighted capacitor bank $C_{B1}$ to $C_{Bn}$ may be a more detailed implementation of variable capacitor $C_B$. The corresponding switches $S_{4B1}$ to $S_{4Bn}$ may be a more detailed implementation of switch $S_{4B}$.

Figure 6:
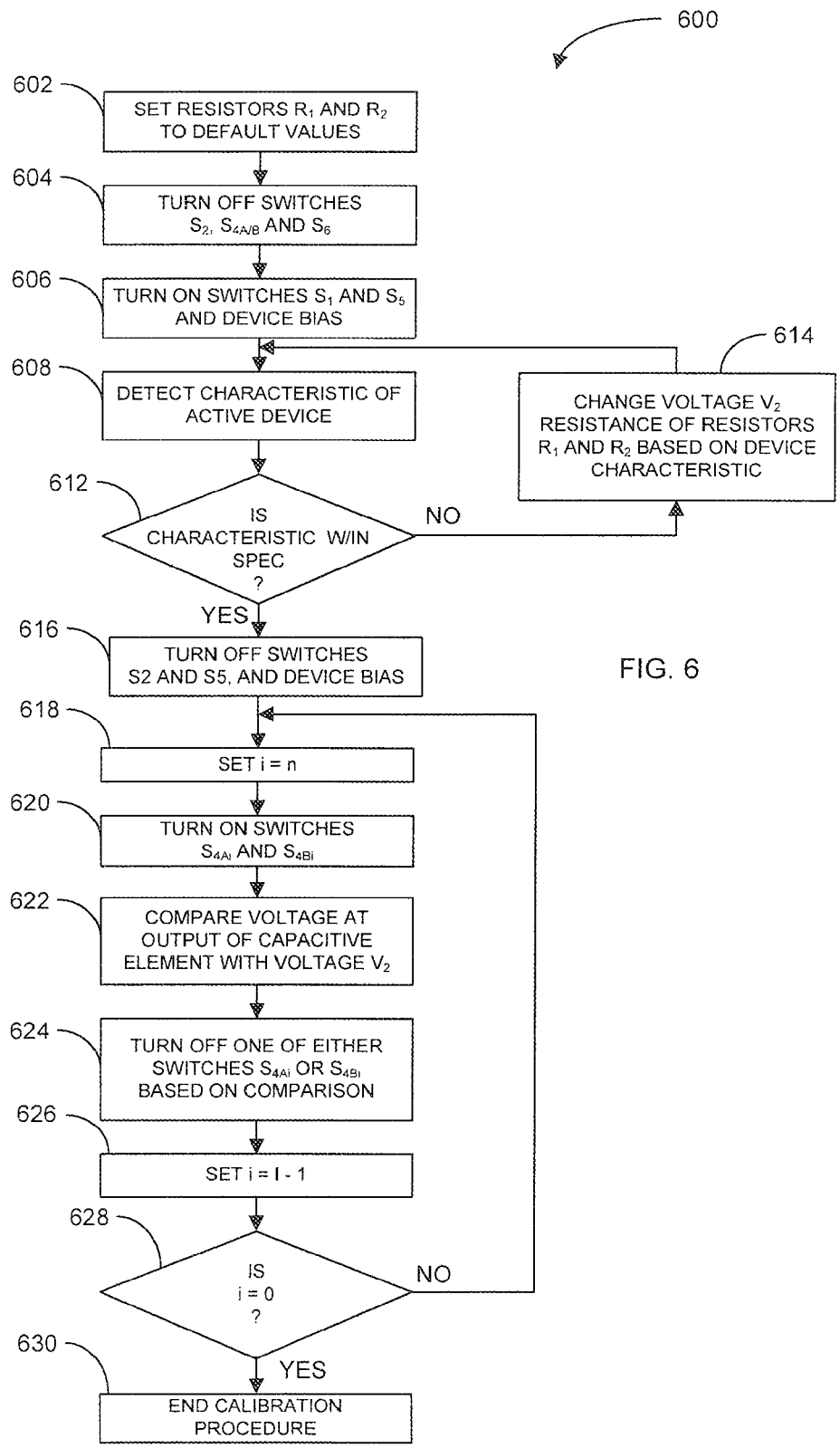
FIG. 6 illustrates a flow diagram of an exemplary method of calibrating an apparatus for generating a bias voltage for an active device in accordance with another aspect of the disclosure.

FIG. 6 illustrates a flow diagram of an exemplary method 600 of calibrating an apparatus for forming a bias voltage for an active device in accordance with another aspect of the disclosure. In summary, according to the method 600, the reference voltage $V_2$ is first calibrated based on one or more detected characteristics of the active device $M_A$ (blocks 602 to 614). Then, the capacitive element module is tuned based on the calibrated reference voltage $V_2$ (blocks 616 to 630).

With further reference to FIG. 3 (the method 600 is also applicable to FIG. 4), the controller 304 sets the resistors $R_1$ and $R_2$ to a default value to generate an initial reference voltage $V_2$ (e.g., ½ of Vdd) (block 602). The controller 304 then turns OFF switches $S_2$, $S_{4A}$, $S_{4B}$ and $S_6$ (block 604). Switch $S_2$ is OFF so that $R_3$ operates to prevent RF leakage therethrough; $S_{4A}$ and $S_{4B}$ are OFF to decouple the capacitors $C_A$ and $C_B$ from the active device $M_A$; and $S_6$ is OFF so that the bias voltage $V_B$ is able to be developed across capacitor Cp. The controller 304 then turns ON switches $S_1$ and $S_5$ to apply the voltage $V_2$ to the gate of the active device $M_A$, and biases the active device $M_A$ by turning ON switches $S_2$ and $S_3$, and turning OFF switch $\overline{S_3}$ (block 606). The active device $M_A$ is then operated in a continuous manner. The controller 304 then detects one or more characteristics (e.g., signal gain, bias voltage $V_B$, etc.) of the active device $M_A$ (block 608).

The controller 304 then determines whether the one or more detected characteristics of the active device $M_A$ are within specification (block 612). If the one or more characteristics of the active device $M_A$ are not within specification, the controller 304 changes the voltage $V_2$ by adjusting resistors $R_1$ and/or $R_2$ based on the one or more characteristics (block 614). As an example, if the gain of the active device $M_A$ is below specification, the controller 304 may adjust resistors $R_1$ and/or $R_2$ to increase the voltage $V_2$ so as to increase the gain of the active device $M_A$. On the other hand, if the gain of the active device $M_A$ is above specification, the controller 304 may adjust resistors $R_1$ and/or $R_2$ to decrease the voltage $V_2$ so as to reduce the gain of the active device $M_A$. The controller 304 repeats some or all of the operations of blocks 604 to 614 until the one or more characteristics of the active device $M_A$ are within specification.

If, in block 612, the controller 304 determines that the one or more characteristics of the active device $M_A$ is within specification, the controller 304 turns OFF switches $S_2$ and $S_5$ as well as the device bias (block 616). The controller 304 may then set an iteration count i to n, the number of binary-weighted capacitors in each capacitor bank (block 618). The controller 304 then turns ON switches $S_{4Ai}$ and $S_{4Bi}$ of the capacitor banks (the remaining capacitors in the banks may be turned OFF) (block 620). The controller 304 then compares the voltage at the output of the capacitive element module with the calibrated voltage $V_2$ (block 622). The controller 304 then turns off either one of switches $S_{4Ai}$ and $S_{4Bi}$ based on the comparison (block 624). The controller 304 then decrements the iteration count i by one (block 626), and determines whether the iteration count i is equal to zero (block 628). If the iteration count i is not equal to zero, then the controller 304 repeats the operations specified in blocks 620 to 628. Otherwise, the controller 304 terminates the calibration procedure (block 630).

Figure 7A:
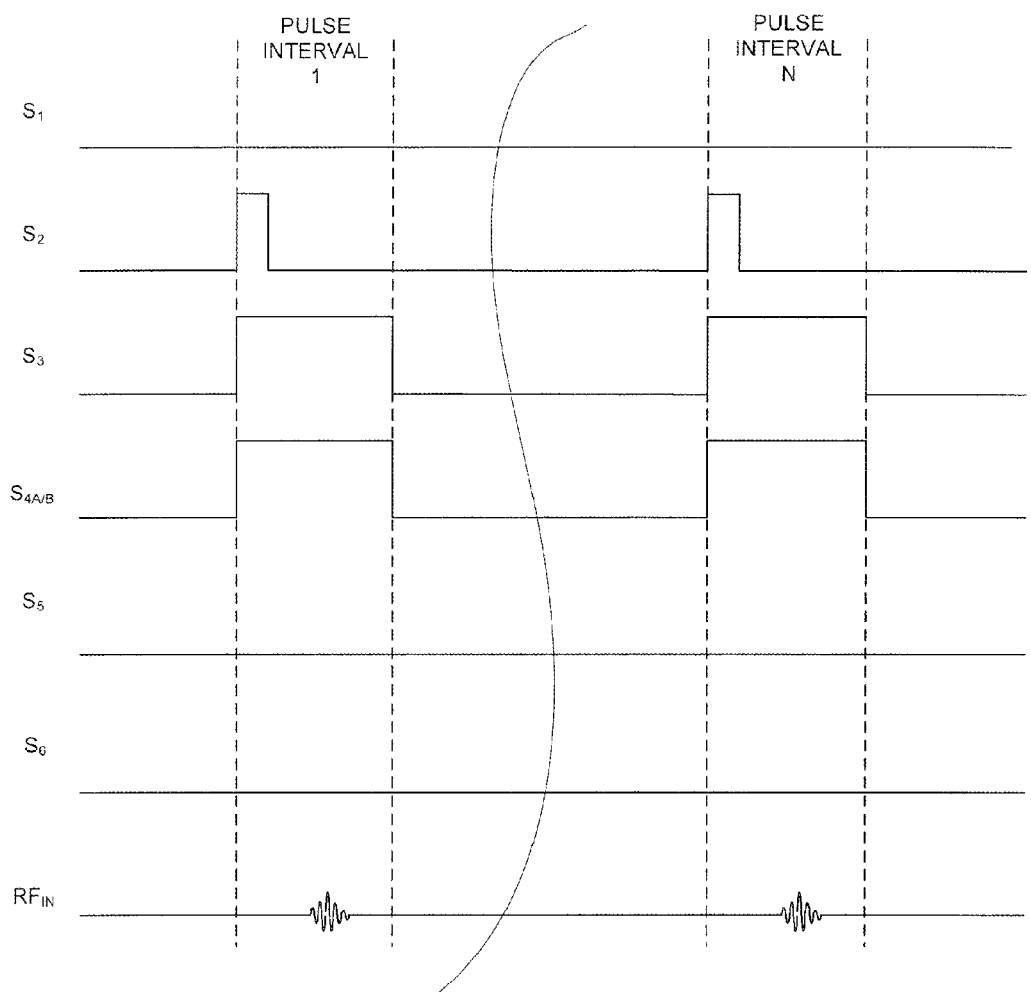
FIG. 7A illustrates a timing diagram related to an exemplary method of generating a bias voltage for an active device in accordance with another aspect of the disclosure.

FIG. 7A illustrates a timing diagram related to an exemplary method of generating a bias voltage $V_B$ for an active device $M_A$ in accordance with another aspect of the disclosure. In this example, the active device $M_A$ is configured to amplify an input RF signal comprising a plurality of pulses. It shall be understood that the input RF signal need not be limited to a signal having pulses. According to the timing diagram, for each pulse interval associated with the input RF signal, the forming of the bias voltage $V_B$ and the activation of the active device $M_A$ entail turning ON switches $S_2$, $S_3$, $S_{4A}$ and $S_{4B}$ at substantially the same time in order to form the bias voltage $V_B$. Switches $S_1$, $S_5$, and $S_6$ may remain OFF during the formation of the bias voltage $V_B$. The switch $S_2$ may be maintained ON until the bias voltage reaches a defined stability, which may be a shorter duration than the ON time of switches $S_3$, $S_{4A}$ and $S_{4B}$. Timing-wise, the pulse of the input RF signal arrives at a time interval when only switches $S_3$, $S_{4A}$ and $S_{4B}$ are ON. Then, after processing of the pulse, the switches $S_3$, $S_{4A}$ and $S_{4B}$ may be turned OFF to complete pulse interval 1. This same process may be repeated for the remaining pulse intervals of the input RF signal, as noted.

Figure 7B:
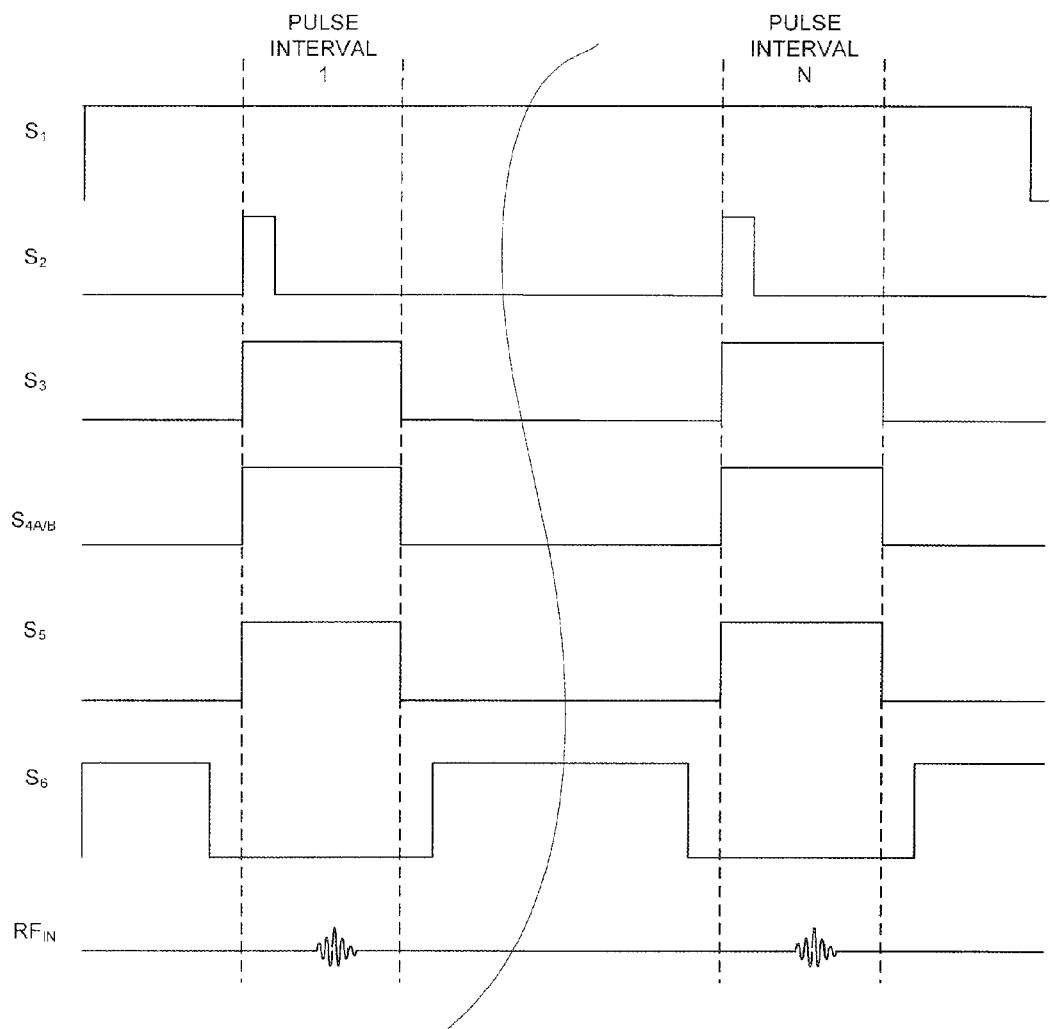
FIG. 7B illustrates a timing diagram related to another exemplary method of generating a bias voltage for an active device in accordance with another aspect of the disclosure.

FIG. 7B illustrates a timing diagram related to an exemplary method of generating a bias voltage $V_B$ for an active device $M_A$ in accordance with another aspect of the disclosure. In this example, the active device $M_A$ is configured to amplify an input RF signal comprising a plurality of pulses. It shall be understood that the input RF signal need not be limited to a signal having pulses. According to the timing diagram, for each pulse interval associated with the input RF signal, the forming of the bias voltage $V_B$ and the activation of the active device $M_A$ entail turning ON switches $S_2$, $S_3$, $S_{4A}$, $S_{4B}$ and $S_5$ at substantially the same time in order to form the bias voltage $V_B$. Switch $S_1$ may be turned ON during the pulse processing process in order to be able to apply the voltage $V_2$ to the active device $M_A$ to compensate for any leakage current associated with the biasing of the active device. Switch $S_6$ may remain OFF from slightly prior to a pulse interval to slightly after the pulse interval so that the bias voltage $V_B$ is able to be developed. Prior to any pulse interval and in between pulse intervals the switch $S_6$ may be turned ON to discharge the capacitor CP, so that the bias voltage $V_B$ may be developed from a known potential (e.g., ground potential). The switch $S_2$ may be maintained ON until the bias voltage reaches a defined stability, which may be a shorter duration than the ON time of switches $S_3$, $S_{4A}$, $S_{4B}$, and $S_5$. Timing-wise, the pulse of the input RF signal arrives at a time interval when only switches $S_3$, $S_{4A}$, $S_{4B}$, and $S_5$ are ON. Then, after processing of the pulse, the switches $S_3$, $S_{4A}$, $S_{4B}$, and $S_5$ may be turned OFF to complete pulse interval 1. This same process may be repeated for the remaining pulse intervals of the input RF signal, as noted.

Figure 8:
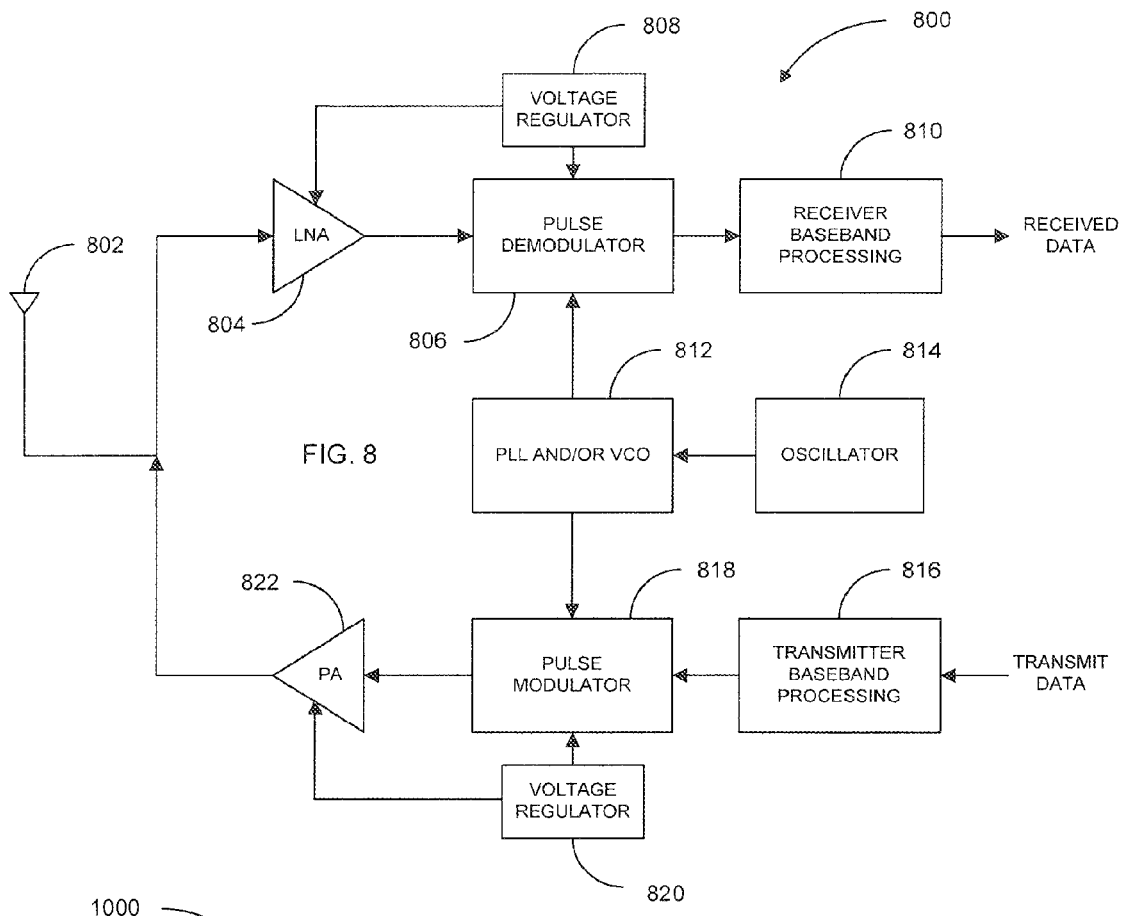
FIG. 8 illustrates a block diagram of an exemplary communication system in accordance with another aspect of the disclosure.

FIG. 8 illustrates a block diagram of an exemplary communication device 800 in accordance with another aspect of the disclosure. The communication device 800 may be one exemplary implementation of a communication device that uses any of the apparatuses previously discussed as a voltage regulator. In particular, the communications device 800 comprises an antenna 802, a low noise amplifier (LNA) 804, a pulse demodulator 806, a first voltage regulator 808, a receiver baseband processing module 810, a phase locked loop (PLL) and/or voltage controlled oscillator (VCO) 812, a reference oscillator 814, a transmitter baseband processing module 816, a pulse modulator 818, a second voltage regulator 820, and a power amplifier (PA) 822.

As a source communication device, data to be transmitted to a destination communication device is sent to the transmitter baseband processing module 816. The transmitter baseband processing module 816 processes the transmit data to generate an outbound baseband signal. The pulse modulator 818 generates pulses (e.g., ultra wideband (UWB) pulses) based on the outbound baseband signal. The second voltage regulator 820 supplies the charge at the proper time to the pulse modulator 818 in order for the pulse to be generated. The PA 822 amplifies the UWB pulses signal and provides it to the antenna 802 via the Tx/Rx isolation device 804 for transmission into a wireless medium. The second voltage regulator 820 also supplies charge at the proper time to the PA 822 in order for the pulse to be amplified. The transmit data may be generated by a sensor, a microprocessor, a microcontroller, a RISC processor, a keyboard, a pointing device such as a mouse or a track ball, an audio device, such as a headset, including a transducer such as a microphone, a medical device, a shoe, a robotic or mechanical device that generates data, a user interface, such as a touch-sensitive display, etc.

As a destination communication device, a received RF signal (e.g., inbound UWB pulses) is picked up by the antenna 802 and applied to the LNA 804, which amplifies the received RF signal. The first voltage regulator 808 supplies the charge at the proper time to the LNA 804 in order for the received signal to be amplified. The pulse demodulator 806 generates an inbound baseband signal based on the received UWB pulses. The first voltage regulator 808 also supplies the charge at the proper time to the pulse demodulator 808 in order to properly process the pulses. The receiver baseband processing 810 processes the incoming baseband signal to generate the received data. A data processor (not shown) may then perform one or more defined operations based on the received data. For example, the data processor may include a microprocessor, a microcontroller, a reduced instruction set computer (RISC) processor, a display, an audio device, such as a headset, including a transducer such as speakers, a medical device, a shoe, a watch, a robotic or mechanical device responsive to the data, a user interface, such as a display, one or more light emitting diodes (LED), etc.

Figure 9A:
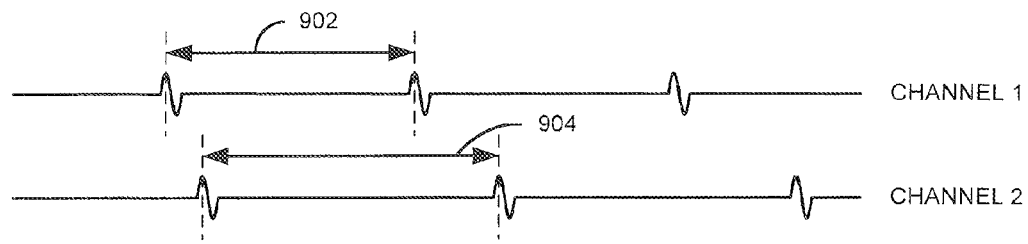
FIGS. 9A-D illustrate timing diagrams of various pulse modulation techniques in accordance with another aspect of the disclosure.

FIG. 9A illustrates different channels (channels 1 and 2) defined with different pulse repetition frequencies (PRF) as an example of a pulse modulation that may be employed in any of the communications systems, devices, and apparatuses described herein. Specifically, pulses for channel 1 have a pulse repetition frequency (PRF) corresponding to a pulse-to-pulse delay period 902. Conversely, pulses for channel 2 have a pulse repetition frequency (PRF) corresponding to a pulse-to-pulse delay period 904. This technique may thus be used to define pseudo-orthogonal channels with a relatively low likelihood of pulse collisions between the two channels.

In particular, a low likelihood of pulse collisions may be achieved through the use of a low duty cycle for the pulses. For example, through appropriate selection of the pulse repetition frequencies (PRF), substantially all pulses for a given channel may be transmitted at different times than pulses for any other channel.

The pulse repetition frequency (PRF) defined for a given channel may depend on the data rate or rates supported by that channel. For example, a channel supporting very low data rates (e.g., on the order of a few kilobits per second or Kbps) may employ a corresponding low pulse repetition frequency (PRF)). Conversely, a channel supporting relatively high data rates (e.g., on the order of a several megabits per second or Mbps) may employ a correspondingly higher pulse repetition frequency (PRF).

Figure 9B:
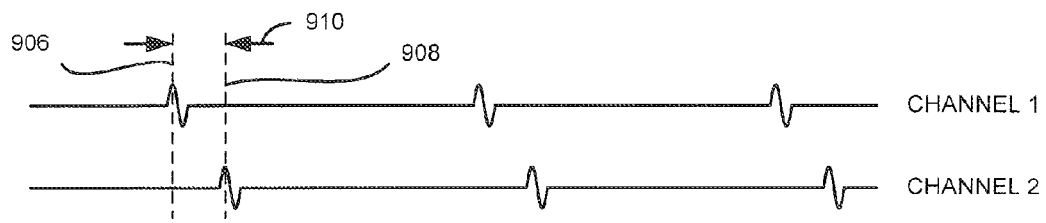

FIG. 9B illustrates different channels (channels 1 and 2) defined with different pulse positions or offsets as an example of a modulation that may be employed in any of the communications systems described herein. Pulses for channel 1 are generated at a point in time as represented by line 906 in accordance with a first pulse offset (e.g., with respect to a given point in time, not shown). Conversely, pulses for channel 2 are generated at a point in time as represented by line 908 in accordance with a second pulse offset. Given the pulse offset difference between the pulses (as represented by the arrows 910), this technique may be used to reduce the likelihood of pulse collisions between the two channels. Depending on any other signaling parameters that are defined for the channels (e.g., as discussed herein) and the precision of the timing between the devices (e.g., relative clock drift), the use of different pulse offsets may be used to provide orthogonal or pseudo-orthogonal channels.

Figure 9C:
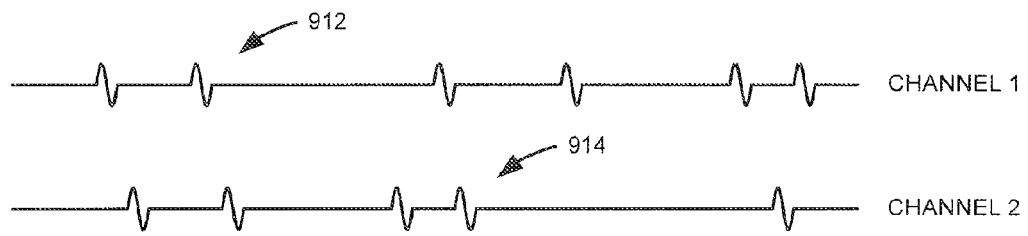

FIG. 9C illustrates different channels (channels 1 and 2) defined with different timing hopping sequences modulation that may be employed in any of the communications systems described herein. For example, pulses 912 for channel 1 may be generated at times in accordance with one time hopping sequence while pulses 914 for channel 2 may be generated at times in accordance with another time hopping sequence. Depending on the specific sequences used and the precision of the timing between the devices, this technique may be used to provide orthogonal or pseudo-orthogonal channels. For example, the time hopped pulse positions may not be periodic to reduce the possibility of repeat pulse collisions from neighboring channels.

Figure 9D:
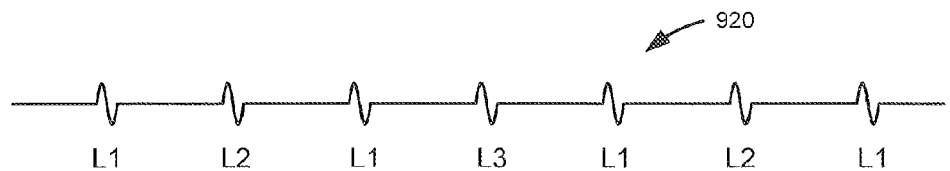

FIG. 9D illustrates different channels defined with different time slots as an example of a pulse modulation that may be employed in any of the communications systems described herein. Pulses for channel L1 are generated at particular time instances. Similarly, pulses for channel L2 are generated at other time instances. In the same manner, pulses for channel L3 are generated at still other time instances. Generally, the time instances pertaining to the different channels do not coincide or may be orthogonal to reduce or eliminate interference between the various channels.

It should be appreciated that other techniques may be used to define channels in accordance with a pulse modulation schemes. For example, a channel may be defined based on different spreading pseudo-random number sequences, or some other suitable parameter or parameters. Moreover, a channel may be defined based on a combination of two or more parameters.

Figure 10:
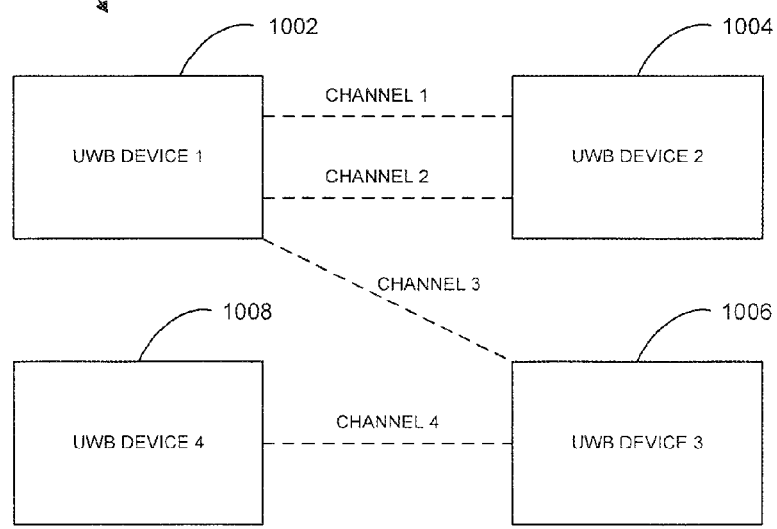
FIG. 10 illustrates a block diagram of various communication devices communicating with each other via various channels in accordance with another aspect of the disclosure.

FIG. 10 illustrates a block diagram of various ultra-wide band (UWB) communications devices communicating with each other via various channels in accordance with another aspect of the disclosure. For example, UWB device 1 1002 is communicating with UWB device 2 1004 via two concurrent UWB channels 1 and 2. UWB device 1002 is communicating with UWB device 3 1006 via a single channel 3. And, UWB device 3 1006 is, in turn, communicating with UWB device 4 1008 via a single channel 4. Other configurations are possible. The communications devices may be used for many different applications, and may be implemented, for example, in a headset, microphone, biometric sensor, heart rate monitor, pedometer, EKG device, watch, shoe, remote control, switch, tire pressure monitor, or other communications devices. A medical device may include smart band-aid, sensors, vital sign monitors, and others. The communications devices described herein may be used in any type of sensing application, such as for sensing automotive, athletic, and physiological (medical) responses.

Any of the above aspects of the disclosure may be implemented in many different devices. For example, in addition to medical applications as discussed above, the aspects of the disclosure may be applied to health and fitness applications. Additionally, the aspects of the disclosure may be implemented in shoes for different types of applications. There are other multitudes of applications that may incorporate any aspect of the disclosure as described herein.

Various aspects of the disclosure have been described above. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. As an example of some of the above concepts, in some aspects concurrent channels may be established based on pulse repetition frequencies. In some aspects concurrent channels may be established based on pulse position or offsets. In some aspects concurrent channels may be established based on time hopping sequences. In some aspects concurrent channels may be established based on pulse repetition frequencies, pulse positions or offsets, and time hopping sequences.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, processors, means, circuits, and algorithm steps described in connection with the aspects disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The steps of a method or algorithm described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects any suitable computer-program product may comprise a computer-readable medium comprising codes relating to one or more of the aspects of the disclosure. In some aspects a computer program product may comprise packaging materials.

While the invention has been described in connection with various aspects, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. An apparatus to generate a bias voltage for an active device, comprising:
    a first voltage source configured to generate a first voltage;
    a first switching element;
    a capacitive element;
    a second switching element; and
    a controller configured to:
        activate the first switching element during a first time interval to couple the first voltage source to the capacitive element to form a charge on the capacitive element based on the first voltage;
        maintain the second switching element deactivated during the first time interval to prevent the charge from transferring to the active device; and
        activate the second switching element during a second time interval to couple the capacitive element to the active device to form the bias voltage for the active device by transferring the charge from the capacitive element to the active device.

2. The apparatus of claim 1, wherein the controller is configured to control a capacitance of the capacitive element.

3. The apparatus of claim 2, wherein the controller is configured to control the capacitance of the capacitive element based on one or more characteristics of the active device.

4. The apparatus of claim 3, wherein the one or more characteristics of the active device comprises a gain of the active device.

5. The apparatus of claim 2, wherein the controller is configured to control the capacitance of the capacitive element based on a reference voltage.

6. The apparatus of claim 5, wherein the reference voltage is based on one or more characteristics of the active device.

7. The apparatus of claim 5, further comprising a second voltage source configured to generate the reference voltage.

8. The apparatus of claim 1, further comprising a second voltage source configured to generate a second voltage to be used to generate the bias voltage.

9. The apparatus of claim 8, wherein the second voltage is based on one or more characteristics of the active device.

10. The apparatus of claim 1, wherein the controller is configured to maintain the first switching element activated during the second time interval to couple the first voltage source to the active device during the second time interval.

11. The apparatus of claim 1, further comprising a third switching element configured to selectively couple the active device to ground or other potential to disable the active device.

12. A method of generating a bias voltage for an active device, comprising:
    generating a first voltage by a first voltage source;
    during a first time interval, performing the following:
        generating a charge on a capacitive element based on the first voltage; and
        maintaining the active device decoupled from the capacitive element and the first voltage source to prevent the transfer of the charge to the active device;
    during a second time interval, delivering, by way of a switching element, the charge to be used to generate the bias voltage for the active device.

13. The method of claim 12, further comprising controlling a capacitance of the capacitive element.

14. The method of claim 13, wherein controlling the capacitance of the capacitive element is based on one or more characteristics of the active device.

15. The method of claim 14, wherein the one or more characteristics of the active device comprises a gain of the active device.

16. The method of claim 13, wherein controlling the capacitance of the capacitive element is based on a reference voltage.

17. The method of claim 16, wherein the reference voltage is based on one or more characteristics of the active device.

18. The method of claim 16, further comprising generating the reference voltage.

19. The method of claim 12, further comprising generating a second voltage to be used to generate the bias voltage.

20. The method of claim 19, wherein the second voltage is a function of one or more characteristics of the active device.

21. The method of claim 12, further comprising applying the first voltage to the active device during the second time interval.

22. The method of claim 12, further comprising applying ground or other potential to the active device to disable the active device.

23. An apparatus to generate a bias voltage for an active device, comprising:
    means for generating a first voltage;
    means for generating a charge based on the first voltage during a first time interval; and
    switching means for decoupling the charge generating means and first voltage generating means from the active device during the first time interval and for delivering the charge from the charge generating means to the active device during a second time interval to be used to generate the bias voltage for the active device.

24. The apparatus of claim 23, further comprising means for controlling a charge capacity of the charge generating means.

25. The apparatus of claim 24, wherein the controlling means is configured to control the charge capacity of the charge generating means based on one or more characteristics of the active device.

26. The apparatus of claim 25, wherein the one or more characteristics of the active device comprises a gain of the active device.

27. The apparatus of claim 24, wherein the controlling means is configured to control the charge capacity of the charge generating means based on a reference voltage.

28. The apparatus of claim 27, wherein the reference voltage is based on one or more characteristics of the active device.

29. The apparatus of claim 27, further comprising means for generating the reference voltage.

30. The apparatus of claim 23, further comprising means for generating a second voltage to be used to generate the bias voltage for the active device.

31. The apparatus of claim 30, wherein the second voltage is based on one or more characteristics of the active device.

32. The apparatus of claim 23, further comprising means for coupling the first voltage generating means to the charge generating means during the second time interval.

33. The apparatus of claim 23, further comprising means for coupling the active device to ground or other potential to disable the active device.

34. A computer program product, comprising:
    a computer readable medium comprising instructions executable by an apparatus to generate a bias voltage for an active device by:
        generating a voltage by a voltage source;
        generating a charge on a capacitive element based on the voltage during a first time interval;
        maintaining the active device decoupled from the capacitive element and the voltage source during the first time interval to prevent the transfer of the charge from the capacitive element to the active device during the first time interval; and
        delivering, by way of a switching element, the charge from the capacitive element to the active device during a second time interval to be used to generate the bias voltage for the active device.

35. A headset, comprising:
    a transducer adapted to generate audio data;
    a transmitter adapted to transmit the audio data;
    a voltage source configured to generate a voltage;
    a first switching element;
    a capacitive element;
    a second switching element; and
    a controller configured to:
        activate the first switching element during a first time interval to couple the voltage source to the capacitive element to form a charge on the capacitive element based on the voltage;
        maintain the second switching element deactivated during the first time interval to maintain the transmitter decoupled from the capacitive element and the voltage source to prevent a transfer of the charge to the transmitter during the first time interval; and
        activate the second switching element during a second time interval to couple the capacitive element to the transmitter to form a bias voltage for the transmitter by transferring the charge from the capacitive element to the transmitter.

36. A user device, comprising:
    a receiver adapted to receive data;
    a voltage source configured to generate a voltage;
    a first switching element;
    a capacitive element;
    a second switching element; and
    a controller configured to:
        activate the first switching element during a first time interval to couple the voltage source to the capacitive element to form a charge on the capacitive element based on the voltage;
        maintain the second switching element deactivated during the first time interval to maintain the receiver decoupled from the capacitive element and the voltage source to prevent a transfer of the charge to the receiver during the first time interval; and
        activate the second switching element during a second time interval to couple the capacitive element to the receiver to form a bias voltage for the receiver by transferring the charge from the capacitive element to the receiver.

37. A sensing device, comprising:
    a sensor adapted to obtain data;
    a transmitter adapted to transmit the data;
    a voltage source configured to generate a voltage;
    a first switching element;
    a capacitive element;
    a second switching element; and
    a controller configured to:
        activate the first switching element during a first time interval to couple the voltage source to the capacitive element to form a charge on the capacitive element based on the voltage;
        maintain the second switching element deactivated during the first time interval to maintain the transmitter decoupled from the capacitive element and the voltage source to prevent a transfer of the charge to the transmitter during the first time interval; and activate the second switching element during a second time interval to couple the capacitive element to the transmitter to form a bias voltage for the transmitter by transferring the charge from the capacitive element to the transmitter.

* * * * *